7/19/77        XR        4,037,152

United States Patent [19]
Griffith

[11] 4,037,152
[45] July 19, 1977

[54] FREQUENCY INDICATING SYSTEM
[75] Inventor: Russell W. Griffith, Dallas, Tex.
[73] Assignee: United Technology Laboratories, Inc., Garland, Tex.
[21] Appl. No.: 85,837
[22] Filed: Nov. 2, 1970
[51] Int. Cl.² ........................................ G01R 23/14
[52] U.S. Cl. ........................... 324/79 R; 324/77 A; 324/77 B
[58] Field of Search ............ 324/78 R, 78 F, 78 J, 324/79 R, 77 B, 77 C, 77 D, 77 G; 328/140, 141

[56] References Cited
U.S. PATENT DOCUMENTS

| | | | |
|---|---|---|---|
| 2,525,679 | 10/1950 | Hurvitz | 324/77 C |
| 3,364,426 | 1/1968 | Hurvitz | 324/77 C |
| 3,416,081 | 12/1968 | Gutleber | 324/77 G |
| 3,467,859 | 9/1969 | Nixon et al. | 324/77 C |
| 3,593,184 | 7/1971 | Herrero | 324/77 B |

Primary Examiner—Maynard R. Wilbur
Assistant Examiner—T. M. Blum
Attorney, Agent, or Firm—Kenneth R. Glaser

[57] ABSTRACT

Disclosed is an apparatus and process for indicating or measuring the frequency of an incoming signal of unknown frequency. The system includes a plurality of processing channels, each of said channels including a pair of oscillators offset in frequency coupled to a pair of harmonic generators for producing respective output signals harmonically related, wherein the fundamental frequency of said harmonic generators are correspondingly offset. A combination of mixers, filters, amplifiers, and frequency-to-voltage convertors are utilized in combination with logic comparator means for producing analog voltage signals representative of the unknown frequency. Examples of utilization and display of these analog signals are illustrated.

10 Claims, 6 Drawing Figures

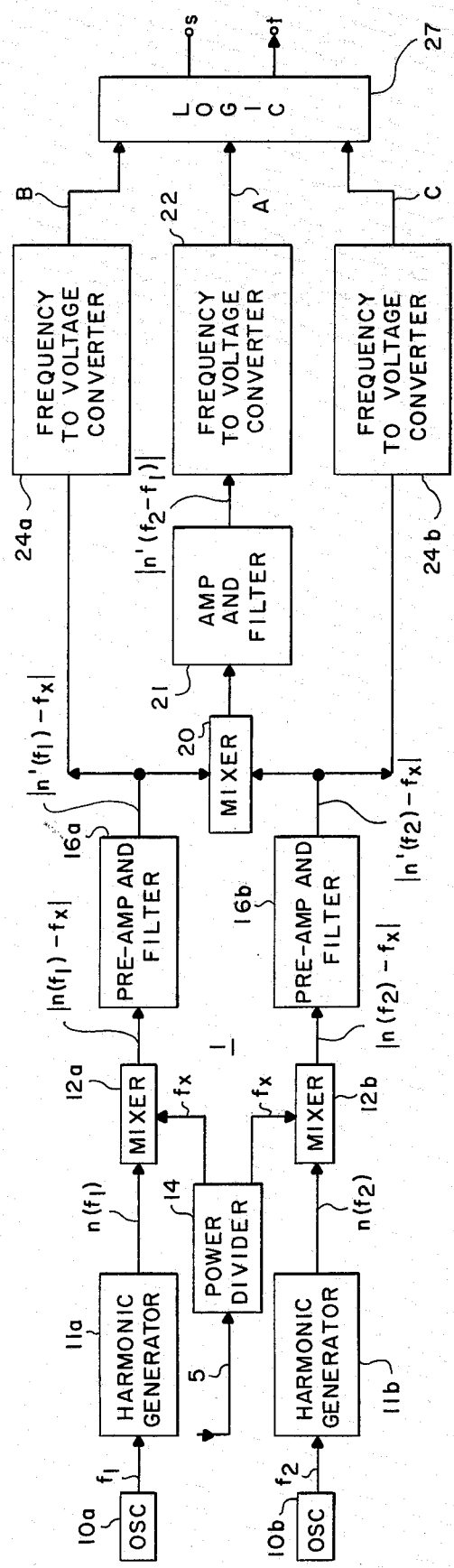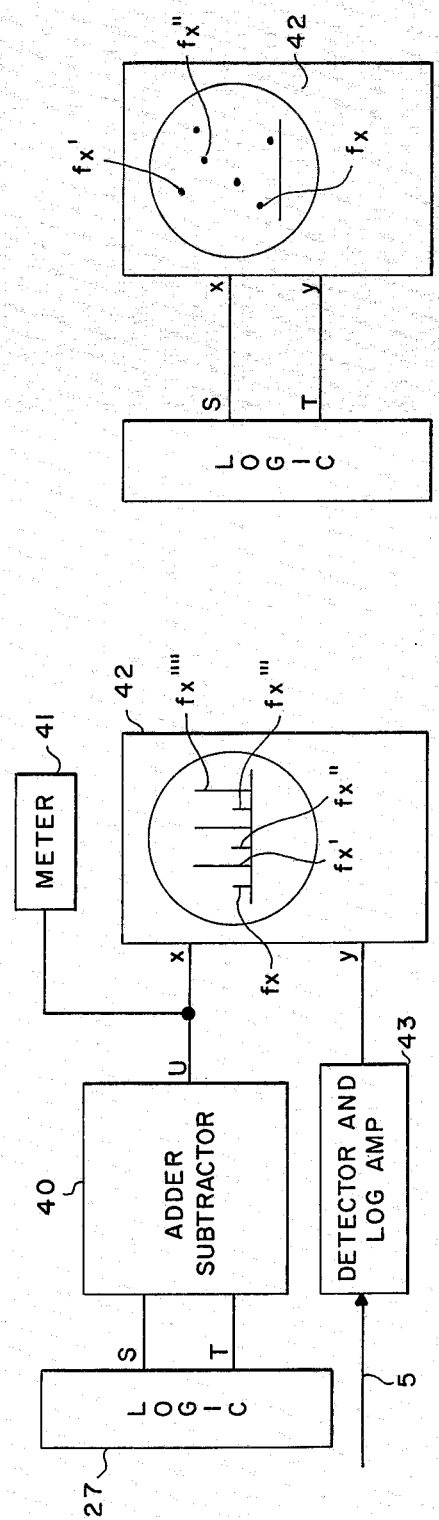
FIG. 1
FIG. 2
FIG. 3
INVENTOR
RUSSELL W. GRIFFITH
KENNETH R. GLASER
ATTORNEY

FREQUENCY INDICATING SYSTEM

This invention pertains to a method and apparatus for indicating frequency, more particularly to an improved frequency measuring system and process utilizing a plurality of processing channels for measuring the frequency of a signal wave of unknown frequency, and even more particularly to a frequency measuring system advantageously utilizing the unique mixing of selective harmonic frequencies with a received input signal of unknown frequency to produce an analog output voltage indicative of the unknown frequency.

Within the field of electronic communication, it is often necessary to identify the frequency of a particular signal being intercepted or to isolate a particular frequency signal from a spectrum of unknown frequency signals being received. For example, in the area of warning and jamming, the level and frequency of a plurality of transmitted signals must be determined and sorted. In addition, in the field of direction finding radar apparatus, received signal of unknown frequency must be identified for subsequent processing.

To accomplish these objectives, many forms of frequency measuring apparatus have been developed, many of which undesirably require phase or amplitude tracking circuits or matched detectors in their operation. Another technique employs a standard frequency source coupled to an arrangement of harmonic and subharmonic generators, the outputs of which are coupled to selector-mixing circuits. A known frequency is selected by the operator for beating with the unknown frequency in successive stages until a zero beat is obtained in the last stage. The readings of the various selectors may then be added together to give the analog value of the unknown frequency.

Among the disadvantages associated with all or some of the prior art apparatus are the inability to rapidly and accurately measure frequencies over a broad spectrum, the inconvenient output data format, and the production of output signals indicative of the measured frequency which are undesirably dependent on signal strength.

It is therefore a primary object of the present invention to provide a new and improved process and apparatus for quickly and accurately measuring or detecting the frequency of received signals over a broad frequency spectrum.

It is another object of the invention to provide frequency measuring apparatus which accurately measures and displays the frequency of received signals independently of the strength of that received signal.

It is a further object of the invention to provide a frequency measuring system which produces output signals indicative of the measured frequency of the input signals in an analog voltage format suitable for subsequent processing and/or display.

It is a still further object of the invention to provide a process and apparatus for detecting and measuring the frequency of a signal wave of unknown frequency employing an advantageous and unique combination of mixing, filtering, and frequency converting.

In accordance with these and other objects, the present invention is directed to a technique and apparatus for respectively mixing the incoming signal of unknown frequency with output signals from a pair of harmonic generators, the fundamental frequencies of the output signals from each generator being offset a predetermined amount from one another. The pair of difference frequency signals obtained from the mixing operation are thereafter filtered to obtain first and second signals, which frequencies are respectively equal to the frequency difference between the unknown signal frequency and a specific harmonic frequency from each of the harmonic generators. The so filtered first and second signals may then be mixed and filtered to produce a third signal, which frequency is proportional to the specific harmonic and independent of the unknown signal frequency. The first and second filtered signals are also coupled, as well as the third signal, to separate frequency-to-voltage convertors for producing first, second and third analog output voltages respectively proportional to the first, second, and third frequency signals. By appropriately scaling and calibrating these convertors, a select one of the first and second analog signals may be combined with the third analog signal to produce an output signal indicative of the unknown frequency.

The just described technique may be adapted to provide an overall system capable of monitoring a broad frequency band by utilizing a plurality of parallel channels, each channel incorporating the above combination of harmonic generators, mixers, filters, and frequency-to-voltage convertors. The outputs from the system may then be applied to oscilloscopes, frequency meters, or other suitable utilization devices.

Additional features, objects, and advantages of the invention will become more apparent by reference to the following detailed description taken in conjunction with the accompanying drawings, in which:

FIG. 1 is a block diagram schematic of a basic network building block of the frequency indicating systems incorporating the principles of this invention;

FIGS. 2 and 3 illustrate two examples of how the output signals from the apparatus of the invention may be utilized;

Figure 4:
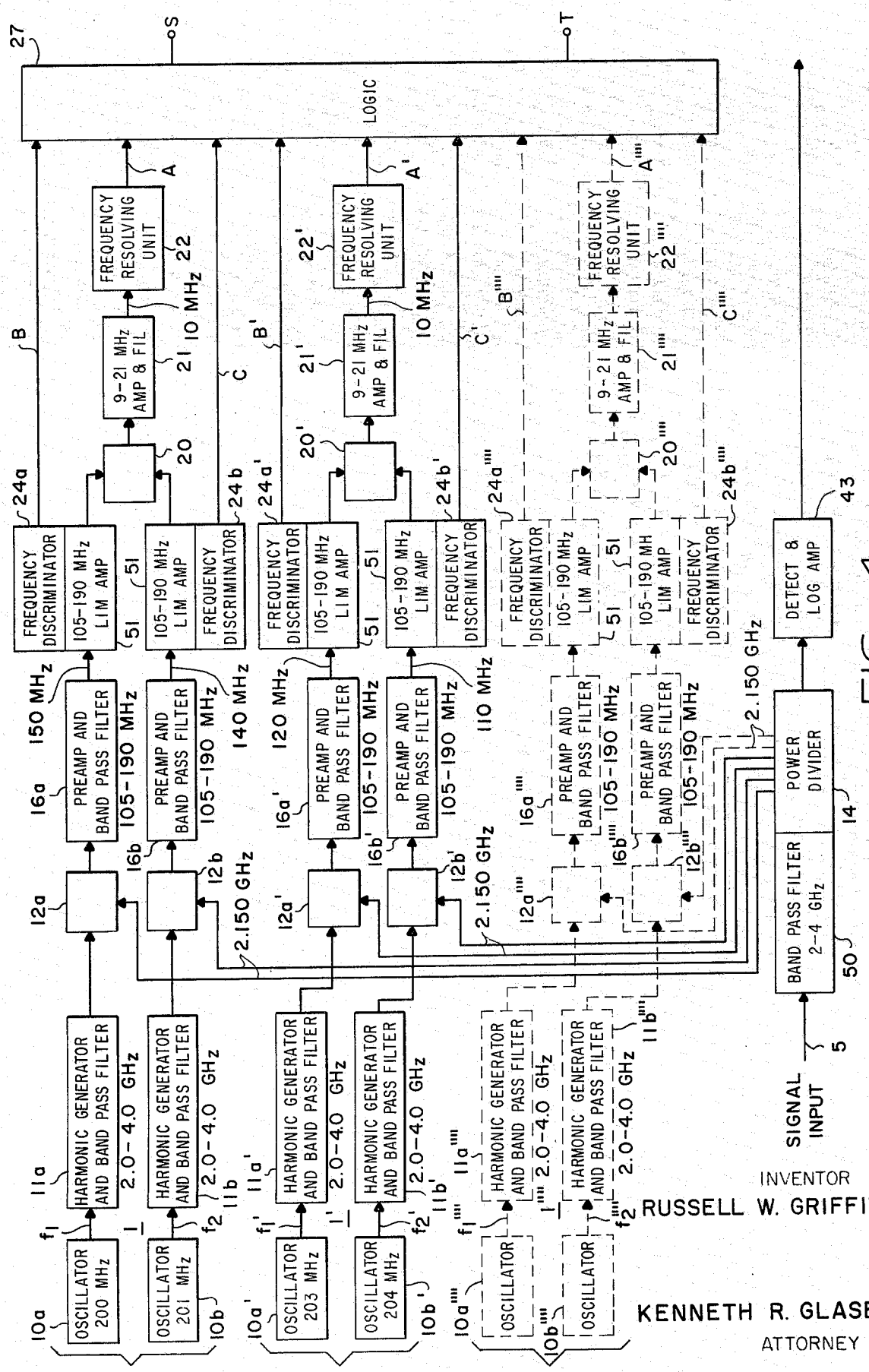
FIG. 4 is a block diagram schematic of an entire frequency measuring system utilizing a plurality of parallel channel networks of the type illustrated in FIG. 1.

Referring now to FIG. 1, there is illustrated the network 1 which provides the basic building block of the frequency measuring apparatus of the present invention. Accordingly, a pair of harmonic generators 11a and 11b are respectively driven by a pair of conventional oscillators 10a and 10b, for example crystal oscillators, the frequency of the output signals from the oscillator 10b being offset a predetermined amount from the frequency of the output signals from the oscillator 10a. Thus, where the frequency of the output signals from the oscillator 10a is designated as $f_1$, and the frequency of the output signal from the oscillator 10b is designated as $f_2$, a respective set of output signals are produced from each of the harmonic generators 11a and 11b having respective frequencies equal to $f_1$, $2(f_1)$ . . . $n(f_1)$ and $f_2$, $2(f_2)$ $3(f_2)$ . . . $n(f_2)$ where $n$ designates each of the numbers of the harmonics (first, second, third, etc.).

Respectively coupled to the outputs of the harmonic generators 11a and 11b are a pair of mixers 12a and 12b for combining the output signals $n(f_1)$ and $n(f_2)$ from the harmonic generators with an incoming signal 5 of unknown frequency $f_x$. Conventional divider means 14 couples the incoming signal 5 to each of the mixers 12a and 12b. As a consequence of this mixing operation, a first set of output signals is produced at the output of the mixer 12a which includes a series of side band signals having frequencies respectively equal to the difference between the incoming signal frequency $f_x$ and each of the harmonic frequencies $n(f_1)$ passed at the output from 11a. In similar manner, a second set of output signals are produced at the output of the mixer 12b which includes a series of side band signals having frequencies respectively equal to the difference between the incoming signal frequency $f_x$ and each of the harmonic frequencies $n(f_2)$ passed at the output from 11b. These frequencies of these first and second set of the series of side band output signals are conveniently designated $|n(f_1) - f_x|$ and $|n(f_2) - f_x|$ respectively in FIG. 1.

Respectively coupled to the output of the mixers 12a and 12b are preamplifier, filter, and limiter means 16a and 16b for amplifying and passing signals only within a defined frequency bandwidth. As a particular feature of the invention, the bandwidth of both filters 16a and 16b are identical and is chosen to pass only those output side band signals from the mixers 12a and 12b having a frequency respectively equal to the difference of the input signal frequency $f_x$ and only a specific harmonic ($n'$) signal frequency $n'(f_1)$ and $n'(f_2)$, where $n'$ represents the specific harmonic.

The output signals from the amplifier-filter means 16a and 16b are therafter coupled to a conventional mixer 20 and amplifier-filter means 21 to produce signals at the output of the means 21 having a frequency equal to the absolute difference of the signal pair supplied to the mixer 20. Consequently, the frequency $|n'(f_2 - f_1)|$ of these ouput signals from the means 21 is completely independent of the frequency $f_x$ of the input signal 5, being proportional to the selected harmonic $n'$.

As a consequence of the signal processing just described, the actual measure of the unknown frequency $f_x$ is equal to the harmonic frequency $n'(f_1)$ or $n'(f_2)$ plus or minus, whichever the case may be, the frequency of the output signal from means 16a or the output signal from means 16b. Specifically, the unknown frequency $f_x$ can be determined by adding the frequency of the output signal at 16a to the harmonic frequency $n'(f_1)$ when the frequency of the output signal at 16a is greater than the frequency of the output signal at 16b, and subtracting the frequency of the output signal at 16a from the harmonic frequency $n'(f_1)$ when the frequency of the output signal at 16a is lesser than the frequency of the output signal at 16b. Alternatively, the frequency $f_x$ can also be determined by adding the frequency of the output signal at 16b to the harmonic frequency $n'(f_2)$ when the frequency of the output signal at 16a is greater than the frequency of the output signal at 16b, and subtracting the frequency of the output signal at 16b from $n'(f_2)$ when the frequency of the output signal at 16a is lesser than the frequency of the output signal at 16b.

Since the frequency of the output signal from means 21 is proportional to the selected harmonic $n'$, measurement of the unknown frequency $f_x$ may be effected by appropriate combination of this signal, appropriately scaled, with the output signals from either means 16a or 16b, in the manner just described. To effect the combination, the output signals from means 21, 16a and 16b are initially coupled to frequency-to-voltage convertors 22, 24a and 24b, as illustrated in FIG. 1, to produce respective analog voltage signals A, B, and C at the outputs therefrom proportional to the frequency of the input signals to these convertors.

Each of the analog voltage signals A, B, and C are thereafter coupled to conventional logic means 27 for providing (1) either (according to the technique chosen, as previously described) the signal B or C at the output terminal T when both signals B and C are present; (2) an indication whether this signal at T is to be added or subtracted; and (3) the analog voltage A at the output terminal S when, and only when, signals are present at the outputs of both convertors 24a and 24b.

Since the outputs from the terminals S and T are in the form of voltages linear with frequency, the network 1 is capable of convenient interfacing with other systems. For example, the analog voltage outputs at S and T may be appropriately combined to produce analog signals representative of the frequencies $f_x$ (as previously described), these analog signals thereafter converted to digital signals for processing by a digital computer and automatically steering other systems to the intercepted frequency.

FIGS. 2 and 3 illustrate two other applications of the frequency measuring apparatus of the invention. Accordingly, the frequency-to-voltage convertor 22 may be appropriately scaled to produce an output voltage A indicative of the frequency $n'(f_1)$, and the convertors 24a and 24b appropriately scaled to produce output voltages B and C suitable for direct addition or subtraction to the signal A. An example of this scaling is subsequently described. The logic circuitry 27 when produces the voltage signal B at the terminal T, along with an indication of whether this voltage is to be added or subtracted from the voltage at S(i.e., whether the signal B or C is greater). The voltages at S and T are then combined according to the "add" or "subtract" instruction by conventional adder-subtracter means 40 (FIG. 2) to produce a voltage at output terminal U indicative of the unknown frequency $f_x$. This signal may then be applied directly to frequency meter 41 which produces a digital readout, for example, of the frequency $f_x$. Alternatively, the so combined signal at U may be coupled to the x or horizontal input to an oscilloscope 42, the input signal 5 itself being applied by way of detector and log amplifier 43 to the y or vertical input to the scope 42. In this manner, by appropriate use of multiplexing and time sharing of the scope, a spectrum analysis of the incoming signals 5 may be simultaneously displayed on the screen of the scope 42 indicating the relative strengths of the frequencies $f_x, f_{x'}, f_{x''}$, etc. of the incoming signals.

As another example of the display of the signals received from the network 1, reference is to FIG. 3 wherein the voltage signal at S is applied directly to the horizontal or x inputs of the scope 42, the voltage at T being applied directly to the vertical or y input of the scope. In this manner, a high resolution display showing frequency vs. $\Delta$ frequency is provided. The increments along the abscissa of the scope correspond to the harmonic frequencies [for example $n'(f_1)$] which have been utilized in the processsing, and the increments along the ordinate represent deviations from these harmonic frequency increments.

The basic network illustrated in FIG. 1 may be advantageously incorporated into a frequency detecting and indicating system capable of monitoring a broad frequency band. Thus, there is illustrated in FIG. 4 of the drawings such an expanded system embodying a plurality of parallel processing channels 1, 1', 1'', etc., each channel comprising identical networks of the type previously described. To facilitate the explanation of the operation of this system, specific examples of frequency ranges and parameters have been chosen for the various components thereof, it being understood that these ranges are only illustrative and are not to be considered limitations as to the frequency range the system of the invention can handle.

For example, the parameters of the system illustrated in FIG. 4 have been initially chosen to process signals 5 of unknown frequency in the 2-4 GHz range. Accordingly, each pair of oscillators 10a and 10b, 10a' and 10b', 10a'' and 10b'', etc. are offset in frequency by 1 MHz, there being a 3 MHz offset between respective oscillators in adjacent channels (for example oscillator 10a and 10a'). Band pass filter means are associated with each of the harmonic generators 11a, 11b, 11a', 11b', etc. to provide output harmonic signals therefrom in the 2.0 to 4.0 GHz range. Filter means 16a, 16b, 16a', 16b', etc. and limit amplifiers 51 have fixed bandwidths of 105-190 MHz, the limit amplifiers 51 providing the input stage to frequency discriminators (frequency-to-voltage convertors) 24a, 24b, etc. to insure the linear operation thereof. Amplifier and filter means 21, 21', 21'', etc. are set to pass only frequencies in the 9-21 MHz range.

To illustrate the operation of the system, assume that the incoming signal 5 of unknown frequency actually has a frequency of 2.150 GHz. This 2.150 GHz signal is coupled by way of power divider 14 to each of the mixers 12a, 12b, 12a', 12b', etc. to produce, among others, output signals having frequencies equal to the difference between the 2.150 GHz signals and the respective harmonic frequencies. Thus the output signal frequencies for the 10th, 11th, and 12th harmonic, for example, from mixer 12a would respectively include 150 MHz, 50 MHz, and 250 MHz; from mixer 12b —140 MHz, 61 MHz, and 262 MHz; from mixer 12a'—120 MHz, 83 MHz, and 286 MHz, and from mixer 12b'—110 MHZ, 94 MHz, and 298 MHz. Band pass filters 16a, 16b, 16a', and 16b' being tuned to the 105-190 MHz range, will thus pass only the 150 MHz, 140 MHz, 120 MHz and 110 MHz signals, respectively. It is thus observed that the pass band of each of these filters passes only frequencies equal to the difference of a specific harmonic (10th, in this example) frequency and the frequency of the incoming signal 5.

The 150 MHz and 140 MHz signals, for example, at the respective outputs of the preamplifier and filter means 16a and 16b are combined in the mixer 21 to produce a 10 MHz signal at the output therefrom. As previously noted, this output signal is equal to the specific harmonic $n'$(10th) times the frequency difference $(f_2 - f_1)$ of the oscillators 10a and 10b.

Figure 5:
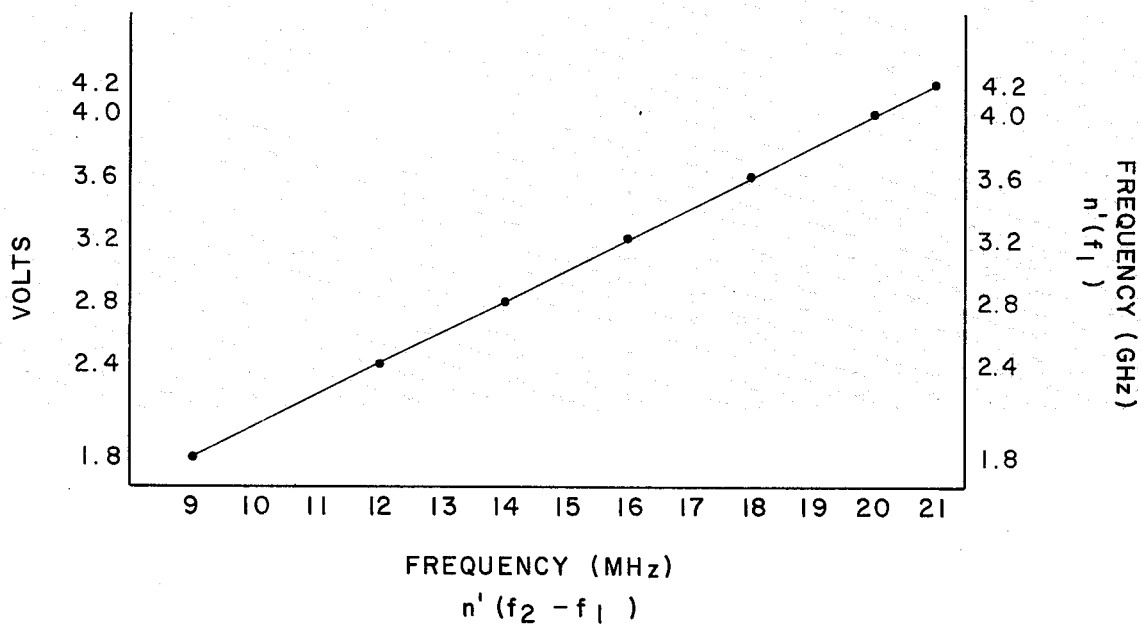
FIG. 5 illustrates a graph of the scaling or calibration of one of the frequency to voltage convertors illustrated in FIG. 4.

This 10 MHz is thereafter coupled to frequency resolving unit 22 for conversion to an analog output voltage proportional thereto. In this particular example, the convertor 22 has its output voltage scaled to be proportional to the frequency output from generator 11a so that 9-21 MHz =1.8 − 4.2 V, as shown in FIG. 5. As a consequence, a voltage of 2.0 volts is produced as signal A.

Figure 6:
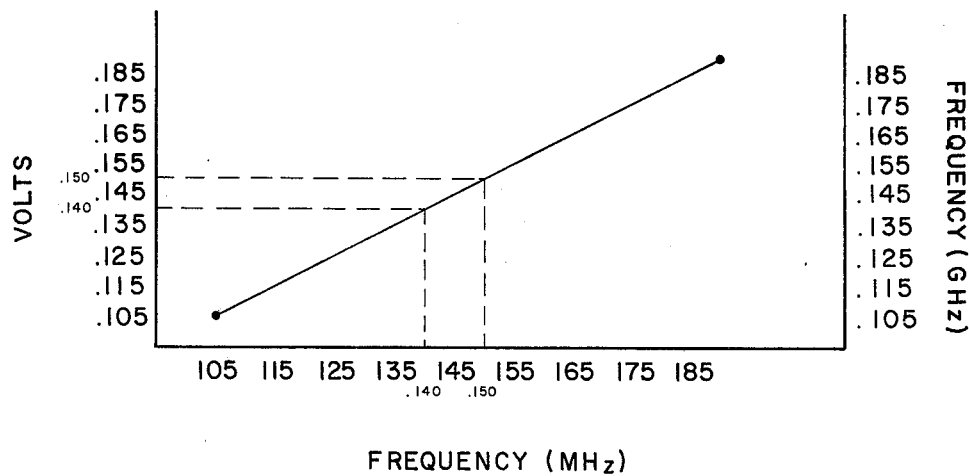
FIG. 6 illustrates a graph of the scaling or calibration of the other frequency to voltage convertors illustrated in FIG. 4.

The 150 MHz and 140 MHz are respectively coupled to frequency discriminators 24a and 24b for production of voltage outputs B and C. The output voltages from each of these discriminators are so scaled to the frequency that 105 - 190 MHZ = 0.105 − 0.190 V, as shown in FIG. 6. The voltage outputs are then scaled on a 1:1 basis to the frequency in GHz.

In accordance with the previous discussion, logic network 27 selects the output signal B (0.150 volts) and, because it is greater than the voltage C (0.140 volts), produces it at the output terminal T along with an "add" indication. The output signal A (2.000 volts) is produced at terminal S. Addition of the voltage at S representing 0.150 GHz to the voltage at T representing 2.000 GHz produces a total voltage representing 2.150 GHz which, in this case, is the correct answer for the frequency of the incoming signal 5. The output signals at S and T may be applied to utilization devices, as previously described.

A similar analysis with respect to the signals in channel 1' illustrates that a correct answer will also be obtained when the greater of the output signals 0.120 volts from discriminators 24a' and 24b'(0.120 V and 0.110 V respectively) is added to the output signal 2.030 volts from the unit 22', this output voltage being scaled to be proportional to the frequency output from generator 11a', the sum of these voltages thus being 2.150 (representing the 2.150 GHz signal). The logic circuitry 27, in fact, gives priority in this instance to channel 1.

In the event that in any of the channels 1, 1', ... 1'''' there is ever a total lack of signal at the output of any of the means 16, the frequency of the output signal from associated mixer 20 would ordinarily be beyond the pass band of filter 21, and the logic circuitry 27 will not pass either the signal B or signal A. Consequently, in this example, no output signal would appear at the terminals S or T as a consequence of the signal processing in that channel.

The value of the oscillator frequencies, as well as the various bandwidths and parameters may be changed vis-a-vis each other depending upon the breadth of the frequency band being monitored, number of channels desired, etc. For example, when only two channels 1 and 1' are desired, and utilizing the bandwidths illustrated for the filters 16, 51, and 21, the following oscillator frequencies may be chosen for monitoring of the corresponding frequency range:

| OSCILLATOR | RANGE | | |
|---|---|---|---|
| | 1 - 2 GHz | 2 - 4 GHz | 4 - 8 GHz |
| 10a | 200 MHz | 200 MHz | 200 MHz |
| 10b | 202 MHz | 201 MHz | 200.5 MHz |
| 10a' | 206 MHz | 203 MHz | 201.5 MHz |
| 10b' | 208 MHz | 204 MHz | 202 MHz |

While the invention has been described with particular reference to a frequency indicating system, it will be apparent to those skilled in the art that the same principles may be used in similar applications and that the precise configuration disclosed and described and components thereof may be varied as desired by those skilled in the art to produce the desired results. It is to be understood that although the invention described with particular reference to specific embodiments thereof, the form of the invention shown and described in detail is to be taken as the preferred embodiment of same and that various changes and modifications may be resorted to without departing from the spirit and scope of the invention.

What is claimed is:

1. Frequency indicating system of the type including a plurality of processing channels for measuring the frequency of a received input signal of unknown frequency, each channel comprising:
  a. first harmonic generating means for producing a first set of output signals, the frequencies of said output signals having harmonic relationships,
  b. second harmonic generating means for producing a second set of output signals, the frequencies of said output signals having harmonic relationships, the fundamental frequency of the second set being offset from the fundamental frequency of the first set by a predetermined amount,
  c. first and second mixer means respectively coupled to the outputs of said first and second harmonic generating means for combining said received input signal with said first and second set of output signals, thereby to produce a first and second series of output signals respectively from said first and second mixer means, each of said series of output signals having frequencies representing the difference between the frequency of said received input signal and the harmonic frequencies of said first and second set of outputs signals,
  d. first and second filter means respectively coupled to the outputs of said first and second mixer means for passing only output signals from each of said mixer means representing the difference between the frequency of said received input signal and a specific one of the said harmonic frequencies,
  e. third mixer means coupled to the outputs of said first and second filter means for combining the output signals passed by said first and second filter means, thereby to produce an output signal from said third mixer means having a frequency proportional to said specific harmonic, and
  f. signal processing means for indicating the relative magnitude of the frequencies between the output signal from said first filter means and the output signals from said second filter means and producing an output signal dependent upon said relative magnitude indication.

2. The system as described in claim 1 wherein the bandwidth of the said first and second filter means is identical.

3. The system as described in claim 2 including separate means coupled to said signal processing means for combining said output signal from said comparator signal processing means with the output signal from said third mixer means, thereby to produce a signal indicative of the frequency of said received input signal.

4. The apparatus as described in claim 3 including frequency-to-voltage converter means respectively coupled to each of said first and second filter means and to said third mixer means for producing analog output voltage as respectively proportional to the input signal frequencies thereto.

5. Apparatus for measuring the frequency of a received input signal, comprising:
  a. first harmonic generating means for producing a first set of output signals, the frequencies of said output signals having harmonic relationships,
  b. second harmonic generating means for producing a second set of output signals, the frequencies of said output signals having harmonic relationships, the fundamental frequency of the second set being offset from the fundamental frequency of the first set by a predetermined amount,
  c. third and fourth means respectively coupled to the outputs of said first and second harmonic generating means for combining said received input signal with a specific harmonic signal from said first and second harmonic generating means, thereby to produce a first difference signal having a frequency equal to the difference of the frequency of said received input signal and the frequency of said specific harmonic signal from said first generating means and a second difference signal having a frequency equal to the difference of the frequency of said received input signal and the frequency of said specific harmonic signal from said second generating means,
  d. fifth means for combining said first and second difference signals, thereby to produce an output signal from said fifth means having a frequency proportional solely to said specific harmonic, and
  e. signal processing means for indicating the relative magnitude of the frequencies of said first and second difference signals and producing an output signal dependent upon said relative magnitude indication.

6. The apparatus as described in claim 5 including means coupled to said signal processing means for combining said output signal from said signal processing means with the output signal from said fifth means, thereby to produce a signal indicative of the frequency of said received input signal.

7. The apparatus as described in claim 5 including frequency to voltage convertor means respectively coupled to said third, fourth, and fifth means for producing analog output voltages respectively proportional to said first and second difference signal frequencies and said specific harmonic.

8. The apparatus as described in claim 5 wherein said third and fourth means each comprise a mixer and filter coupled thereto, the bandwidths of said filters being identical.

9. A process for measuring the frequency of a signal of unknown frequency, comprising:
  a. mixing said unknown frequency signal with a first set of harmonic signals, to produce a first set of difference signals having frequencies equal to the difference of the frequency of said unknown signal and the frequencies of said first set of harmonic signals,
  b. mixing said unknown frequency signal with a second set of harmonic signals having a fundamental frequency offset from the fundamental frequency of said first set, thereby to produce a second set of difference signals having frequencies equal to the difference of the frequency of said unknown signal and the frequencies of said second set of harmonic signals,
  c. filtering said first and second set of difference signals to select only one frequency signal from each of said first and second sets of difference signals, each of said selected frequency signals being indicative of a specific harmonic,
  d. mixing each of said selected frequency signals to produce an output signal proportional to said specific harmonic, and
  e. combining said output signal with one of said selected frequency signals, thereby to produce another output signal representative of said signal of unknown frequency.

10. The process as described in claim 9 including the step of applying said another output signal to display means for displaying said unknown frequency signal.

* * * * *